United States Patent
Doorenbos et al.

(10) Patent No.: US 6,844,775 B2
(45) Date of Patent: Jan. 18, 2005

(54) OPERATIONAL AMPLIFIER WITH ADJUSTABLE INPUT OFFSET

(75) Inventors: Jerry L. Doorenbos, Tucson, AZ (US); David M. Jones, Tucson, AZ (US); Mikhail V. Ivanov, Erlangen (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/431,793

(22) Filed: May 7, 2003

(65) Prior Publication Data

US 2004/0222844 A1 Nov. 11, 2004

(51) Int. Cl.[7] .............................. H03F 1/02; H03F 3/45
(52) U.S. Cl. ............................................. 330/9; 330/69
(58) Field of Search ................................ 327/124, 307; 330/9, 11, 69

(56) References Cited

U.S. PATENT DOCUMENTS 4,163,947 A * 8/1979 Weedon ...................... 327/341

* cited by examiner

Primary Examiner—Steven J. Mottola
(74) Attorney, Agent, or Firm—W. Daniel Swayze, Jr.; W. James Brady; Frederick J. Telecky, Jr.

(57) ABSTRACT

An operational amplifier having an adjustable input offset is provided that can improve dynamic performance by allowing processing of the input signal in continuous-time. The amplifier circuit comprises an input source and an operational amplifier configured with an adjustable input offset circuit. The adjustable input offset circuit enables cancellation of the offset error from any input sources prior to being translated or gained up by the operational amplifier, thus improving the dynamic range of the operational amplifier. The adjustable input offset circuit can be configured within a signal path of an auto-zero loop of the operational amplifier, or with a continuous-time implementation.

24 Claims, 3 Drawing Sheets

US 6,844,775 B2

OPERATIONAL AMPLIFIER WITH ADJUSTABLE INPUT OFFSET

FIELD OF INVENTION

The present invention relates to amplifiers. More particularly, the present invention relates to an operational amplifier having an adjustable input offset voltage for use with input sources in high-precision applications.

BACKGROUND OF THE INVENTION

The demand for improved operational amplifiers, and in particular amplifier circuits for high-precision data acquisition and instrumentation applications, such as multi-channel data acquisition systems, current shunt monitors, and industrial or physiological sensors, continues to increase. High precision amplifier circuits typically require at least 0.1% accuracy with input full-scale signals as low as 5 mV. Critical specifications for such devices include the amount of offset voltage, the amount of offset drift, and the peak-to-peak noise.

One approach for minimizing offset voltage in an operational amplifier, such as an instrumentation amplifier, is through implementation of auto-zeroing techniques. In such auto-zeroing techniques, one or more $G_m$ stages in the operational amplifier are configured within an auto-zero loop to generate an offset correcting voltage comprising an output-referred offset error opposite in magnitude to the offset voltage of the operational amplifier. The offset correcting voltage is summed with the offset voltage to result in no offset effect in the operational amplifier, i.e., the offset voltage does not translate through to the output of the instrumentation amplifier.

With reference to FIG. 1, a sensor amplifier circuit 100 is illustrated, with amplifier circuit 100 including a sensor 102 and an instrumentation amplifier 104. Sensor 102 is represented by a bridge circuit comprising four resistors R, and can comprise any sensor circuit providing a sensed voltage to instrumentation amplifier 104. Instrumentation amplifier 104 comprises a pair of operational amplifiers $A_1$ and $A_2$ configured in a differential input/differential output configuration, i.e., with input terminals $V_{IN}^+$ and $V_{IN}^-$ and output terminals $V_{OUT}^+$ and $V_{OUT}^-$, and can also comprise various other instrumentation amplifier configurations. Operational amplifiers $A_1$ and $A_2$ can be configured with auto-zero configurations of one or more stages to correct for the offset voltage within instrumentation amplifier 104.

Some input source devices, such as sensors, include a useful small signal riding on top of a relatively large offset voltage. The offset voltage needs to be subtracted before the small signal is provided to an amplifier to prevent over-ranging of the signal path. Unfortunately with present auto-zeroing techniques, an offset voltage $VOS_{SENSOR}$ of sensor 102 is not corrected, i.e., only the offset voltage of instrumentation amplifier 104 is corrected, and thus offset voltage $VOS_{SENSOR}$ can translate, or is gained up, by instrumentation amplifier 104. For example, for offset voltage $VOS_{SENSOR}$ equal to approximately 10 mV, and with instrumentation amplifier 104 having a gain of approximately 100, an offset error of approximately 1V can result at output terminals $V_{OUT}^+$ and $V_{OUT}^-$ of instrumentation amplifier 104. Accordingly, the dynamic range at the output of amplifier 104 is lost due to the translating of offset voltage $VOS_{SENSOR}$.

To minimize problems caused by offset voltage $VOS_{SENSOR}$, manufacturing techniques can be applied, such as laser trimming, while other techniques can include processing offset voltage $VOS_{SENSOR}$ and then subtracting out the translated signal. Unfortunately, such techniques are more complicated or costly, e.g., the addition of trimming procedures to the manufacturing process, or the requirement to amplify and process offset voltage $VOS_{SENSOR}$ before the offset is subtracted, thus reducing the dynamic range, and potentially saturating instrumentation amplifier 104.

Another approach to reducing the offset within an operational amplifier includes the use of long-used potentiometer devices to address the offset error through manual adjustment of the offset voltage of the operational amplifier in a continuous-time manner. However, such potentiometer techniques are not adequate for high-speed, high-precision applications currently being demanded. Other approaches utilize sampled switch-capacitor techniques, but unfortunately these switch-capacitor techniques cannot be readily adopted for continuous-time signal applications. Moreover, the above techniques still translate offset error with any input source, such as sensors, to the operational amplifier output at the cost of dynamic range performance.

SUMMARY OF THE INVENTION

In accordance with various aspects of the present invention, an operational amplifier having an adjustable input offset is provided that can improve dynamic performance by allowing processing of the input signal in continuous-time. In accordance with an exemplary embodiment, an amplifier circuit comprises an input source and an operational amplifier configured with an adjustable input offset circuit. The adjustable input offset circuit enables cancellation of the offset error from any input sources prior to being translated or gained up by the operational amplifier, thus improving the dynamic range of the amplifier circuit.

In accordance with various exemplary embodiments, the adjustable input offset circuit can be configured within a continuous signal path of an auto-zero loop of the operational amplifier, or with a continuous-time implementation.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

The present invention may be described herein in terms of various functional components. It should be appreciated that such functional components may be realized by any number of hardware or structural components configured to perform the specified functions. For example, the present invention may employ various integrated components, such as buffers, current mirrors, and logic devices comprised of various electrical devices, e.g., resistors, transistors, capacitors, diodes and the like, whose values may be suitably configured for various intended purposes. In addition, the present invention may be practiced in any integrated circuit application. However for purposes of illustration only, exemplary embodiments of the present invention will be described herein in connection with operational amplifiers configured with input sources. Further, it should be noted that while various components may be suitably coupled or connected to other components within exemplary circuits, such connections and couplings can be realized by direct connection between components, or by connection through other components and devices located therebetween.

Figure 1:
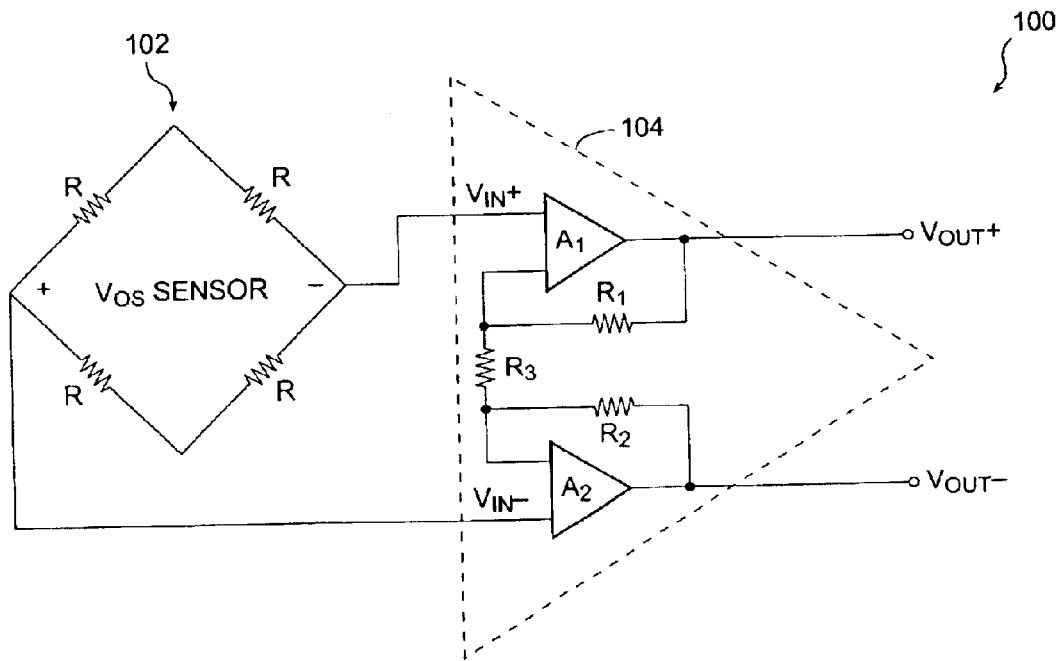
FIG. 1 illustrates a schematic diagram of a prior art sensor amplifier circuit.
Figure 2:
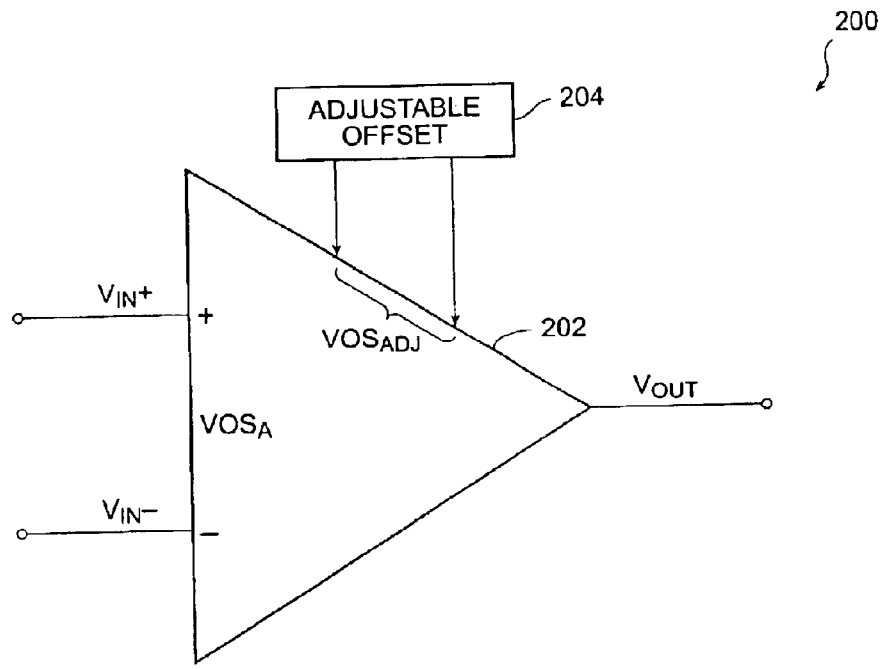
FIG. 2 illustrates a block diagram of an exemplary operational amplifier circuit with an adjustable offset circuit in accordance with an exemplary embodiment of the present invention.

In accordance with various aspects of the present invention, an operational amplifier having an adjustable input offset is provided that can improve dynamic performance by allowing processing of the input signal in a continuous-time manner. In accordance with an exemplary embodiment, an amplifier circuit comprises an input source and an operational amplifier configured with an adjustable input offset circuit. The input source can comprise any configuration, such as, for example, sensor 102 illustrated in FIG. 1. The operational amplifier can also comprise various configurations. For example, with reference to FIG. 2, an exemplary operational amplifier 200 comprises an amplifier 202 having input terminals $V_{IN}^+$ and $V_{IN}^-$ for coupling to an input source, and an adjustable input offset circuit 204.

Adjustable input offset circuit 204 is configured to enable cancellation of any offset error occurring from any input source prior to being translated or gained up by operational amplifier 200, thus improving the dynamic range of operational amplifier 200. Adjustable input offset circuit 204 comprises an offset voltage reference source that provides an adjustable offset voltage $VOS_{ADJ}$ that can be suitably adjusted to cancel out any offset error of any input source in real-time.

In accordance with an exemplary embodiment, instead of providing adjustable offset voltage $VOS_{ADJ}$ to cancel out only the offset voltage $VOS_A$ of amplifier circuit 202, adjustable input offset circuit 204 is configured to sum adjustable offset voltage $VOS_{ADJ}$ with the offset voltage $VOS_A$ of amplifier circuit 202 such that the total offset voltage cancels out any offset voltage in the input source, i.e., $(VOS_{ADJ}+VOS_A)+VOS_{SENSOR}=0$. Accordingly, any input offset error $VOS_{SENSOR}$ of any input source can be canceled out prior to amplification of input offset error $VOS_{SENSOR}$ by operational amplifier 200, resulting in improved dynamic range.

Figure 3:
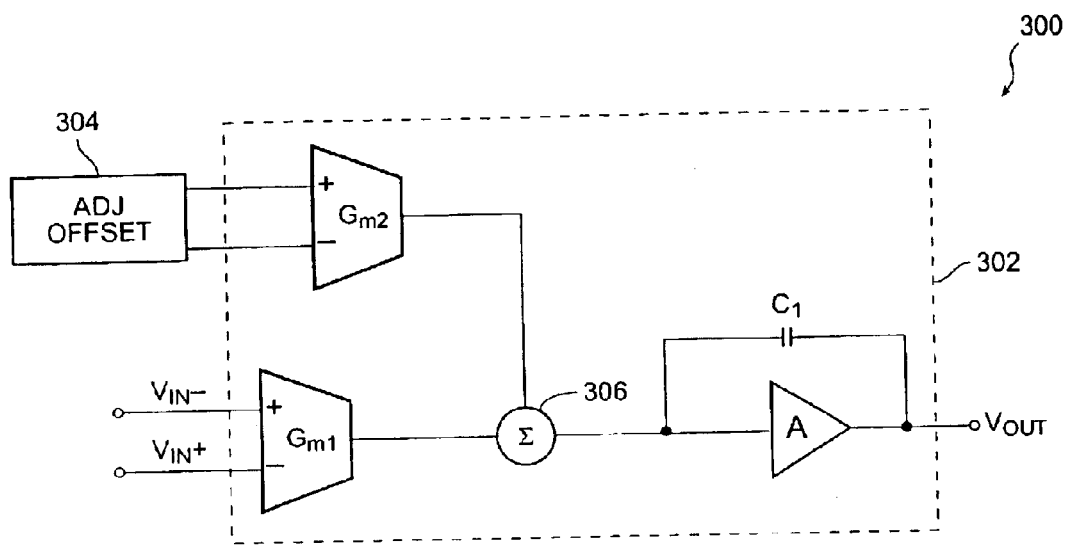
FIG. 3 illustrates a block diagram of another exemplary operational amplifier circuit in accordance with an exemplary embodiment of the present invention.

In accordance with various exemplary embodiments, adjustable input offset circuit 204 can be configured in various manners. For example, with reference to FIG. 3, an operational amplifier 300 can comprise an amplifier 302 and an adjustable input offset circuit 304 configured in a continuous-time implementation. Amplifier 302 comprises a first stage $G_{m1}$, a second stage $G_{m2}$, and an output stage $A_1$. First stage $G_{m1}$ is configured in a direct signal path through a summer 306 with output stage $A_1$ having a compensation capacitor $C_1$. First stage $G_{m1}$ comprises any $G_m$ configuration, and includes a pair of input terminals for coupling to an input source, such as a sensor, for receiving input signals $V_{IN}^+$ and $V_{IN}^-$. Output stage $A_1$ can comprise any output stage configuration, and includes an output terminal for providing an output signal $V_{OUT}$.

Adjustable offset circuit 304 is coupled to second stage $G_{m2}$, which can be coupled to summer 306. While first stage $G_{m1}$ and second stage $G_{m2}$ can be scaled in various manners, in the exemplary embodiment, first stage $G_{m1}$ and second stage $G_{m2}$ are scaled approximately equal. Adjustable offset circuit 304 provides an adjustable offset voltage to second stage $Gm_2$ for summing with an input offset of amplifier 300. Thus, the total offset voltage of operational amplifier 300 can cancel out any input offset occurring from an input source and received at input terminals $V_{IN}^+$ and $V_{IN}^-$, prior to translation of the input offset occurring from an input source through amplifier 302.

Figure 4:
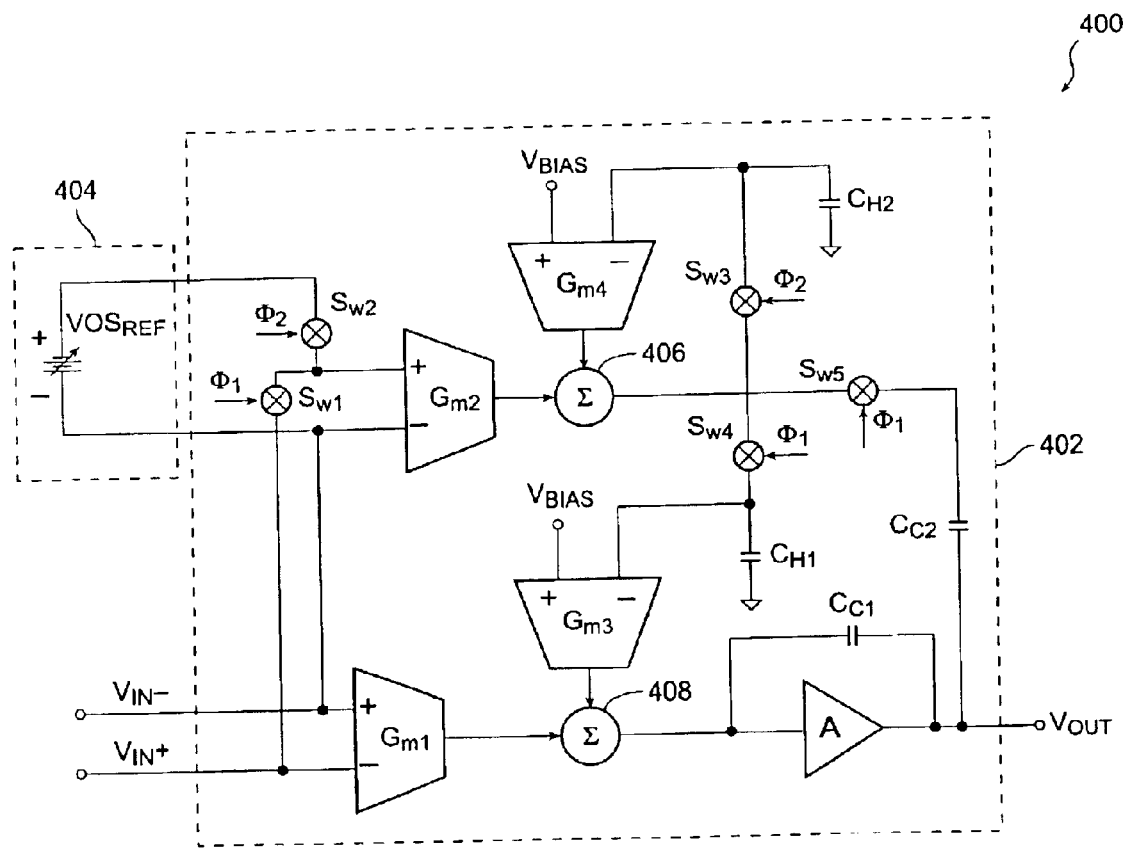
FIG. 4 illustrates a block diagram of another exemplary operational amplifier circuit in accordance with an exemplary embodiment of the present invention.

To reduce errors that may be present within first stage $G_{m1}$ and second stage $G_{m2}$, as well as noise that can be realized from the continuous-time implementation of operational amplifier 300, adjustable offset circuit 304 can also be configured within a signal path of an auto-zero operational amplifier circuit. For example, with reference to FIG. 4, an operational amplifier 400 comprises an amplifier 402 and an adjustable offset circuit 404.

Amplifier 402 includes a first stage $G_{m1}$, a second stage $G_{m2}$, a third stage $G_{m3}$, a fourth stage $G_{m4}$, and an output stage $A_1$. First stage $G_{m1}$ is configured in a feed-forward, continuous-time signal path through a summer 408 with an input terminal of output stage $A_1$. First stage $G_{m1}$ comprises any $G_m$ configuration, and includes a pair of input terminals for coupling to an input source, such as a sensor, for receiving input signals $V_{IN}^+$ and $V_{IN}^-$. Output stage $A_1$ can comprise any output stage configuration, and includes an output terminal for providing an output signal $V_{OUT}$. Output stage $A_1$ further includes a compensation capacitor $C_{C1}$ coupled to the input and the output terminal, and another compensation capacitor $C_{C2}$ coupled to the output terminal. Compensation capacitors $C_{C1}$ and $C_{C2}$ are configured to determine the frequency behavior of amplifier 402.

Second stage $G_{m2}$, third stage $G_{m3}$, and fourth stage $G_{m4}$ are configured within an auto-zero loop of amplifier 402, and can comprise any $G_m$ configuration. To facilitate operation of the auto-zero loop, amplifier 402 also includes switches $SW_1$, $SW_2$, $SW_3$, $SW_4$, and $SW_5$, and storage capacitors $C_{H1}$ and $C_{H2}$. In addition, the negative input terminal of second stage $G_{m2}$ is coupled to the positive input terminal of first stage $G_{m1}$, thus preventing common mode errors between the two phases of operation of switches $SW_1$, $SW_2$, $SW_3$, $SW_4$, and $SW_5$.

Second stage $G_{m2}$ and fourth stage $G_{m4}$ are configured to generate an offset correction signal to third stage $G_{m3}$, which operates as a correction component for the auto-zero loop. Second stage $G_{m2}$ and fourth stage $G_{m4}$ have output signals summed at a summer 406. Fourth stage $G_{m4}$ includes a bias voltage $V_{BIAS}$ coupled to a positive input terminal and a storage capacitor $C_{H2}$ coupled to the negative input terminal. Switch $SW_3$ is configured in a feedback arrangement with fourth stage $G_{m4}$, i.e., coupled to the negative input terminal of fourth stage $G_{m4}$ and the output terminal at summer 406. Third stage $G_{m3}$ includes a bias voltage $V_{BIAS}$ coupled to a positive input terminal and a storage capacitor $C_{H1}$ coupled to the negative input terminal. In addition, the negative input terminal of third stage $G_{m3}$ is also coupled through switch $SW_4$ to summer 406. The offset correction signal generated by third stage $G_{m3}$ can be summed with summer 408 to the offset error of first stage $G_{m1}$. The total offset error of amplifier 402 is configured to cancel out any offset error resulting from an input source, such as a sensor, that is received at the input terminals of first stage $G_{m1}$ as well as the offset voltages of the input stages $G_{m1}$, $G_{m2}$.

Adjustable offset circuit 404 suitably comprises an offset voltage reference source that provides an adjustable offset voltage $VOS_{REF}$ that can be suitably adjusted to cancel out not only the offset error of amplifier 402, but also any offset error of any input source coupled to the input terminals of amplifier 402 in real-time, i.e., any input source coupled to the input terminals of first stage $G_{m1}$. Adjustable offset circuit 404 includes a positive terminal coupled through switch $SW_2$ to the positive input terminal of second stage $G_{m2}$, and a negative terminal coupled to the negative input terminal of second stage $G_{m2}$. Adjustable offset circuit 404 can comprise various values and various voltage generation circuits for generating or otherwise providing an adjustable offset voltage $VOS_{REF}$.

For conventional auto-zero loop configurations, a second stage $G_{m2}$ includes a switch connected between the positive and negative input terminals, such that when the switch is closed, the positive and negative input terminals are shorted together, thus generating an output referred offset error. This offset error is used to generate an error signal to exactly cancel the offset error for the amplifier, but unfortunately, does not address offset error resulting from any input source coupled to the input terminals of the amplifier. However, during a phase one of operation of operational amplifier 400, switches $SW_2$ and $SW_3$ are closed, and switches $SW_1$, $SW_4$, and $SW_5$ are opened. With switch $SW_2$ closed, adjustable offset voltage $VOS_{REF}$ is provided across the input terminals of second stage $G_{m2}$ generating an output error based on the magnitude of adjustable offset voltage $VOS_{REF}$, as opposed to generating an output error based on zero volts if the input terminals were shorted.

Accordingly, second stage $G_{m2}$ generates an output error signal based on the magnitude of adjustable offset voltage $VOS_{REF}$ and its own offset voltage. Meanwhile, switch $SW_3$ is closed to provide a unity-gain feedback loop, around fourth stage $G_{m4}$. The output signal of second stage $G_{m2}$ is canceled out by the output signal of fourth stage $G_{m4}$. Switch $SW_3$ is then opened, and thus, the voltage at the negative input terminal of fourth stage $G_{m4}$ is stored across storage capacitor $C_{H2}$. The value of the voltage stored across storage capacitor $C_{H2}$ is equal: $V_{Ch2}=V_{BIAS}+(G_{m2}/G_{m4})*(VOS_{REF}+VOS_{Gm2})+VOS_{Gm4}$.

After switches $SW_2$ and $SW_3$ are opened, during a next phase, switches $SW_1$, $SW_4$, and $SW_5$ are closed. With switch $SW_1$ closed, input signals $V_{IN}^+$ and $V_{IN}^-$ are applied across the input terminals of second stage $G_{m2}$ generates an output signal based on the input signals $V_{IN}^+$ and $V_{IN}^-$. As switch $SW_3$ is still open, fourth stage $G_{m4}$ provides an output signal equal to adjustable offset voltage $VOS_{REF}$ when referred to the input terminals of second stage $G_{m2}$. In addition, with switch $SW_4$ closed, third stage $G_{m3}$ is configured in a high-gain signal path with second stage $G_{m2}$. The overall gain of the cascaded stages $G_{m2}$ and $G_{m3}$ is higher than the gain of the feed-forward stage $G_{m1}$, and thus third $G_{m3}$ will attempt to drive the overall offset of the operational amplifier to the offset of second stage $G_{m2}$.

Accordingly, when the auto-zero loop is connected back to the direct signal path, i.e., when switches $SW_5$ and $SW_4$ are closed, the equivalent input offset of amplifier 402 is equal to the magnitude of adjustable offset voltage $VOS_{REF}$. Once switch $SW_4$ opens, the input voltage at third stage $G_{m3}$ is stored across storage capacitor $C_{H1}$ continuing to provide the compensating input voltage to third stage $G_{m3}$. As a result, the equivalent input offset of amplifier 402 can be configured to suitably cancel any input offset provided at the input of operational amplifier 400 and caused by an input source, such as a sensor.

Figure 5:
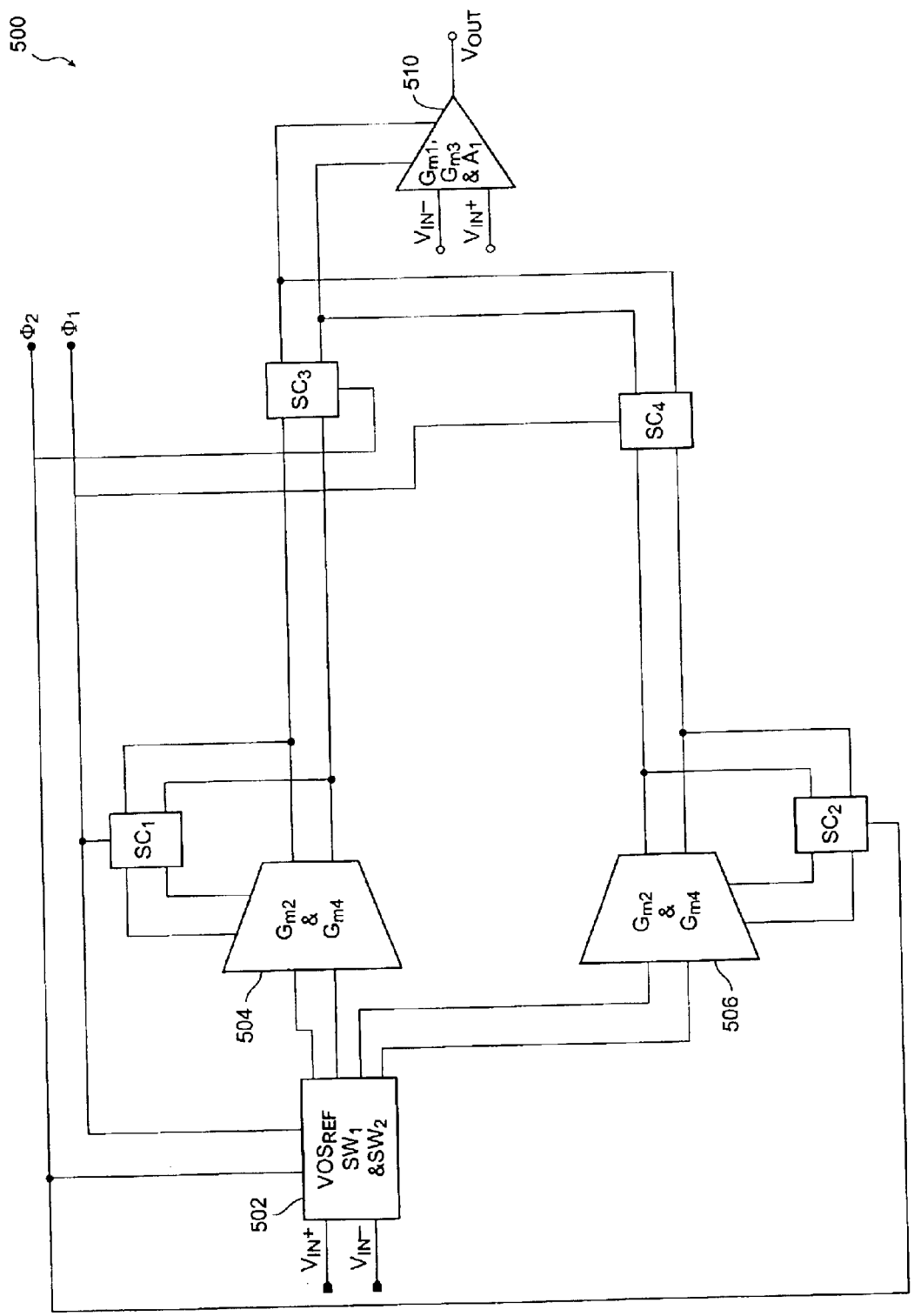
FIG. 5 illustrates a schematic diagram of an exemplary operational amplifier circuit in accordance with an exemplary embodiment of the present invention.

Adjustable offset circuit 404 can be implemented with various configurations of amplifier 402 with an auto-zero loop. For example, with reference to FIG. 5, an amplifier 402 and an adjustable offset circuit 404 can be configured within an operational amplifier 500 and configured to provide two-phases of auto-zero loop operation. In accordance with this exemplary embodiment, operational amplifier 500 includes a first block 502 comprising adjustable offset voltage $VOS_{REF}$ and switches $SW_1$ and $SW_2$, a second block 504 and a third block 506, each comprising a second stage $G_{m2}$ and a fourth stage $G_{m4}$, and a fourth block 510 comprising a direct signal path including first stage $G_{m1}$, third stage $G_{m3}$, and output stage $A_1$. First block 502 includes a pair of input terminals and two pairs of output terminals, one pair for second block 504 and another pair for third block 506.

Second block 504 and third block 506 are configured to provide a dual-phase auto-zero function for operational amplifier 500. Switch circuits $SC_1$ and $SC_2$ are configured with second block 504 and third block 506 to provide functions similar to switches $SW_3$ and $SW_4$ of amplifier 402. Differential output terminals from second block 504 and third block 506 are provided through a pair of switch circuits $SC_3$ and $SC_4$ to fourth block 510. Switch circuits $SC_3$ and $SC_4$ are configured to facilitate dual phase auto-zero operation, with second block 504 configured for driving fourth block 510 during a first phase of operation, i.e., second stage $G_{m2}$ and a fourth stage $G_{m4}$ of second block 504 drive third stage $G_{m3}$ of fourth block 510, and third block 506 configured for driving fourth block 510 during a second phase of operation, i.e., second stage $G_{m2}$ and a fourth stage $G_{m4}$ of third block 506 drive third stage $G_{m3}$ of fourth block 510, thus providing continuous auto-zero operation. Such an auto-zero configuration can suitably eliminate a storage capacitor, such as storage capacitor $C_{H1}$.

In addition to the auto-zero configurations of amplifier 402 and/or amplifier 500, an adjustable offset circuit can be configured with any other auto-zero loop configurations. In other words, an adjustable offset circuit can be implemented with any auto-zero loop configuration for an amplifier circuit.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by implementing JFET devices for the various switching devices. In addition, one or more additional stages may be included at the input or output of the second stage in accordance with various exemplary embodiments. Further, the various exemplary embodiments can be implemented with other types of operational amplifier circuits in addition to the circuits illustrated above. These alternatives can be suitably selected depending upon the particular application or in consideration of any number of factors associated with the operation of the system. Moreover, these and other changes or modifications are intended to be included within the scope of the present invention, as expressed in the following claims.

What is claimed is:

1. An operational amplifier configured to provide offset correction, said operational amplifier comprising:

an amplifier having an offset voltage, said amplifier configured for receiving an input signal having an offset voltage and for providing an amplified output signal, said amplifier comprising an adjustable input offset voltage source configured for providing an adjustable offset; and wherein said adjustable offset is configured to sum with said offset voltage of said amplifier to provide an offset correction voltage to cancel said offset voltage of said input signal to prevent said offset voltage of said input signal from being translated through said amplifier to said amplified output signal.

2. An operational amplifier configured to provide offset correction, said operational amplifier comprising:

an amplifier having an offset voltage, said amplifier configured for receiving an input signal having an offset voltage and for providing an amplified output signal, said amplifier comprising an adjustable input offset circuit configured for providing an adjustable offset; and wherein said adjustable offset is configured to sum with said offset voltage of said amplifier to provide an offset correction voltage to cancel said offset voltage of said input signal to prevent said offset voltage of said input signal from being translated through said amplifier to said amplified output signal, wherein said amplifier is configured in a continuous-time implementation comprising:

a first stage $G_{m1}$ configured in a direct signal path and having an output;

a second stage $G_{m2}$ having input terminals coupled to said adjustable input offset circuit and an output terminal summed with said output of said first stage $G_{m1}$; and an output stage $A_1$ having an input terminal coupled to said summed output terminal of said second stage $G_{m2}$ and said output of said first stage $G_{m1}$.

3. The operational amplifier according to claim 2, wherein said amplifier is configured in an auto-zero loop configuration.

4. The operational amplifier according to claim 3, wherein said amplifier comprises:

a direct signal path comprising a first stage $G_{m1}$ and having an output terminal, and an output stage $A_1$ having an input terminal coupled to said output terminal of said first stage $G_{m1}$; and an auto-zero loop comprising a second stage $G_{m2}$ having input terminals coupled to said adjustable input offset circuit, a fourth stage $G_{m4}$ having an output terminal summed with an output terminal of said second stage $G_{m2}$, and a third stage $G_{m3}$ having an input terminal coupled to said output terminal of said fourth stage $G_{m4}$ and an output terminal summed with said output terminal of said first stage $G_{m1}$.

5. The operational amplifier according to claim 3, wherein said amplifier comprises a first switch and a second switch, said first switch is configured to couple a first stage $G_{m1}$ during a first phase, and said second switch is configured to couple said auto-zero loop to said adjustable input offset circuit during a second phase.

6. The operational amplifier according to claim 3, wherein said auto-zero loop configuration is configured for dual-phase operation.

7. The operational amplifier according to claim 6, wherein said auto-zero loop configuration comprises a first block comprising said adjustable offset circuit, a second block and a third block, each comprising a second stage $G_{m2}$ and a fourth stage $G_{m4}$, and a fourth block comprising a first stage $G_{m1}$, a third stage $G_{m3}$, and an output stage $A_1$.

8. The operational amplifier according to claim 7, wherein said auto-zero loop configuration comprises a single storage capacitor in each of said second and third blocks.

9. The operational amplifier according to claim 2, wherein said adjustable input offset circuit comprises a positive terminal coupled through a switch to a positive input terminal of a second stage $G_{m2}$ of said amplifier, and a negative input terminal coupled directly to a negative input terminal of said second stage $G_{m2}$.

10. The operational amplifier according to claim 1, wherein said operational amplifier comprises an input source configured for providing said input signal to said amplifier.

11. An amplifier circuit for cancellation of offset error caused by an input source coupled to an operational amplifier, said amplifier circuit comprising:

an amplifier configured for receiving an output signal from an input source, and for providing an amplified output signal, said amplifier having an offset error; and an adjustable offset input voltage source coupled to said amplifier and configured to provide an adjustable offset, said amplifier circuit being configured to sum said adjustable offset with said offset error of said amplifier to provide an offset correction voltage, said offset correction voltage configured to cancel the offset error of an input source to prevent the offset error of the input source from being translated through said amplifier to said amplified output signal.

12. An amplifier circuit for cancellation of offset error caused by an input source coupled to an operational amplifier, said amplifier circuit comprising:

an amplifier configured for receiving an output signal from an input source, and for providing an amplified output signal, said amplifier having an offset error; and an adjustable offset input circuit coupled to said amplifier and configured to provide an adjustable offset, said amplifier circuit being configured to sum said adjustable offset with said offset error of said amplifier to provide an offset correction voltage, said offset correction voltage configured to cancel the offset error of an input source to prevent the offset error of the input source from being translated through said amplifier to said amplified output signal, wherein said amplifier is configured in a continuous-time implementation comprising:

a first stage $G_{m1}$ configured in a direct signal path and having an output;

a second stage $G_{m2}$ having input terminals coupled to said adjustable input offset circuit and an output terminal summed with said output of said first stage $G_{m1}$; and an output stage $A_1$ having an input terminal coupled to said summed output terminal of said second stage $G_{m2}$ and said output of said first stage $G_{m1}$.

13. The amplifier circuit according to claim 11, wherein said amplifier is configured in an auto-zero loop configuration.

14. The amplifier circuit according to claim 13, wherein said auto-zero loop configuration is configured for dual-phase operation.

15. An amplifier circuit for cancellation of offset error caused by an input source coupled to an operational amplifier, said amplifier circuit comprising:

an amplifier configured for receiving an output signal from an input source, and for providing an amplified output signal, said amplifier having an offset error; and an adjustable offset input circuit coupled to said amplifier and configured to provide an adjustable offset, said amplifier circuit being configured to sum said adjustable offset with said offset error of said amplifier to provide an offset correction voltage, said offset correction voltage configured to cancel the offset error of an input source to prevent the offset error of the input source from being translated through said amplifier to said amplified output signal, wherein said amplifier comprises:

a direct signal path comprising a first stage $G_{m1}$ and having an output terminal, and an output stage $A_1$ having an input terminal coupled to said output terminal of said first stage $G_{m1}$; and an auto-zero loop comprising a second stage $G_{m2}$ having input terminals coupled to said adjustable input offset circuit, a fourth stage $G_{m4}$ having an output terminal summed with an output terminal of said second stage $G_{m2}$, and a third stage $G_{m3}$ having an input terminal coupled to said output terminal of said fourth stage $G_{m4}$ and an output terminal summed with said output terminal of said first stage $G_{m1}$.

16. An amplifier circuit for cancellation of offset error caused by an input source coupled to an operational amplifier, said amplifier circuit comprising:

an amplifier configured for receiving an output signal from an input source, and for providing an amplified output signal, said amplifier having an offset error; and an adjustable offset input circuit coupled to said amplifier and configured to provide an adjustable offset, said amplifier circuit being configured to sum said adjustable offset with said offset error of said amplifier to provide an offset correction voltage, said offset correction voltage configured to cancel the offset error of an input source to prevent the offset error of the input source from being translated through said amplifier to said amplified output signal, wherein said amplifier is configured in an auto-zero loop configuration, and wherein said amplifier comprises a first switch and a second switch, said first switch is configured to couple a first stage $G_{m1}$ to said auto-zero loop during a first phase, and said second switch is configured to couple said auto-zero loop to said adjustable input offset circuit during a second phase.

17. A method for providing an adjustable offset reference to an operational amplifier to cancel input offset error caused by an input source coupled to an input stage $G_m$ of said operational amplifier, said method comprising the steps of:

providing an adjustable offset voltage $VOS_{REF}$ across input terminals of a second stage $G_m$;

generating an output error in said operational amplifier based on a magnitude of said adjustable offset voltage $VOS_{REF}$; and summing said output error with the input output error caused by the input source such that said input offset error is reduced prior to translating said input offset error through said operational amplifier.

18. The method according to claim 17, wherein the step of generating said output error is conducted within an auto-zero loop configuration.

19. The method according to claim 18, wherein said step of providing said adjustable offset voltage $VOS_{REF}$ comprises coupling through a first switch to an auto-zero loop during a first phase, and coupling through a second switch said auto-zero loop to said adjustable offset voltage $VOS_{REF}$ during a second phase.

20. The method according to claim 17, wherein the step of generating said output error is conducted within an auto-zero loop configured for dual-phase operation.

21. The method according to claim 17, wherein the step of generating said output error is conducted in a continuous-time implementation.

22. An amplifier circuit for cancellation of offset error caused by an input source coupled to an operational amplifier, said amplifier circuit comprising:

an amplifier configured for receiving an output signal from an input source and for providing an amplified output signal, said amplifier having an offset error, said amplifier comprising a direct signal path and an auto-zero loop; and an adjustable offset input voltage source coupled to said amplifier and configured to provide an adjustable offset; and wherein said auto-zero loop is configured to sum said adjustable offset with said offset error of said amplifier to provide an offset correction voltage, said offset correction voltage configured to cancel the offset error of an input source to prevent the offset error of the input source from being translated through said amplifier to said amplified output signal.

23. An amplifier circuit for cancellation of offset error caused by an input source coupled to an operational amplifier, said amplifier circuit comprising:

an amplifier configured for receiving an output signal from an input source and for providing an amplified output signal, said amplifier having an offset error, said amplifier comprising a direct signal path and an auto-zero loop; and an adjustable offset input circuit coupled to said amplifier and configured to provide an adjustable offset; and wherein said auto-zero loop is configured to sum said adjustable offset with said offset error of said amplifier to provide an offset correction voltage, said offset correction voltage configured to cancel the offset error of an input source to prevent the offset error of the input source from being translated through said amplifier to said amplified output signal, and wherein said direct signal path comprises a first stage $G_{m1}$ and having an output terminal, and an output stage $A_1$ having an input terminal coupled to said output terminal of said first stage $G_{m1}$, and said auto-zero loop comprises a second stage $G_{m2}$ having input terminals coupled to said adjustable input offset circuit, a fourth stage $G_{m4}$ having an output terminal summed with an output terminal of said second stage $G_{m2}$, and a third stage $G_{m3}$ having an input terminal coupled to said output terminal of said fourth stage $G_{m4}$ and an output terminal summed with said output terminal of said first stage $G_{m1}$.

24. An amplifier circuit for cancellation of offset error caused by an input source coupled to an operational amplifier, said amplifier circuit comprising:

an amplifier configured for receiving an output signal from an input source and for providing an amplified output signal, said amplifier having an offset error, said amplifier comprising a direct signal path and an auto-zero loop; and an adjustable offset input circuit coupled to said amplifier and configured to provide an adjustable offset; and wherein said auto-zero loop is configured to sum said adjustable offset with said offset error of said amplifier to provide an offset correction voltage, said offset correction voltage configured to cancel the offset error of an input source to prevent the offset error of the input source from being translated through said amplifier to said amplified output signal, and wherein said amplifier comprises a first switch and a second switch, said first switch is configured to couple a first stage $G_{m1}$ to said auto-zero loop during a first phase, and said second switch is configured to couple said auto-zero loop to said adjustable input offset circuit during a second phase.

* * * * *